(12) United States Patent
Rooney et al.

(10) Patent No.: US 7,051,253 B2
(45) Date of Patent: *May 23, 2006

(54) PSEUDO FAIL BIT MAP GENERATION FOR RAMS DURING COMPONENT TEST AND BURN-IN IN A MANUFACTURING ENVIRONMENT

(75) Inventors: Randall Rooney, Boise, ID (US); Joerg Vollrath, Richmond, VA (US)

(73) Assignee: Infineon Technologies Richmond LP, Sandston, VA (US)

( * ) Notice: Subject to any disclaimer, the term of this patent is extended or adjusted under 35 U.S.C. 154(b) by 653 days.

This patent is subject to a terminal disclaimer.

(21) Appl. No.: 09/931,125

(22) Filed: Aug. 16, 2001

(65) Prior Publication Data

US 2003/0084387 A1  May 1, 2003

(51) Int. Cl.
*G11C 29/00* (2006.01)
(52) U.S. Cl. ...................... 714/718; 714/723
(58) Field of Classification Search ......... 714/718–723
See application file for complete search history.

(56) References Cited

U.S. PATENT DOCUMENTS

| | | | | |
|---|---|---|---|---|
| 5,588,115 | A | * 12/1996 | Augarten | 714/718 |
| 5,961,653 | A | * 10/1999 | Kalter et al. | 714/718 |
| 6,643,807 | B1 * | 11/2003 | Heaslip et al. | 714/719 |
| 6,651,206 | B1 * | 11/2003 | Hosokawa et al. | 714/738 |

OTHER PUBLICATIONS

Schanstra et al., Semiconductor manufacturing process monitoring using built-in self-test for embedded memories, Oct. 1998, International Test Conference proceedings 1998, pp 872-881.*
NN9111377 (Reconfigurable Signature Generator. IBM Tech. Disclosure Bulletin, vol. # 34 Issue # 6, pp. 377-380, Nov. 1, 1991).*
Schanstra, Ivo, et al., *Semiconductor Manufacturing Process Monitoring Using Built-In Self-Test for Embedded Memories*.
Vollrath, Jorg, et al., *Compressed Bit Fail Maps for Memory Fail Pattern Classification*.
Vollrath, Joerg, *Tutorial: Characterizing SDRAMS*.

* cited by examiner

*Primary Examiner*—Guy Lamarre
(74) *Attorney, Agent, or Firm*—Brinks Hofer Gilson & Lione (57) ABSTRACT

According to an embodiment of the present invention, a method is provided for determining a fail string for a device. The method includes determining a test pattern for a portion of an address space wherein the test pattern includes at least one address in the address space and the portion of the address space includes at least one x address and at least one y addresses. The method executes a test a plurality of times for each test pattern, wherein every combination of the test pattern is tested, wherein the combinations include each address held at a first potential for at least a first test and a second potential for at least a second test. The method includes determining a fail string for the device including pass/fail results for the test pattern, and combining the pass/fail results in the fail string.

17 Claims, 11 Drawing Sheets

Fig. 1

| | | | | | | | | |
|---|---|---|---|---|---|---|---|---|
| Test step | | X0=0 | X0=1 | X1=0 | X1=1 | Y0=0 | Y0=1 | Y1=0 | Y1=1 |
| Chip | | . | F | F | . | . | F | . | F |

| 1 | 2 | 1 | 2 |
|---|---|---|---|
| 3 | 4 | 3 | 4 |
| 1 | 2 | 1 | 2 |
| 3 | 4 | 3 | 4 |

| 5 | 5 | 6 | 6 |
|---|---|---|---|
| 5 | 5 | 6 | 6 |
| 7 | 7 | 8 | 8 |
| 7 | 7 | 8 | 8 |

256k SRAM    139  145

PSEUDO FAIL BIT MAP GENERATION FOR RAMS DURING COMPONENT TEST AND BURN-IN IN A MANUFACTURING ENVIRONMENT

BACKGROUND OF THE INVENTION

1. Field of the Invention

The present invention relates to classifying failing semiconductor memories, and more particularly to a method of classifying memories based on pass/fail information.

2. Discussion of the Prior Art

The process of manufacturing semiconductor memories is one of the drivers of higher integration technologies. Testing memories gives feed back for the improvement of the manufacturing process. During testing, bit fail maps are generated showing failed memory cells. Bit maps are used to determine a repair solution to replace failed memory cells with good spare ones and/or determine an improved manufacturing process. Due to the regularity of the memory array fail patterns can be related to process problems.

Figure 1:
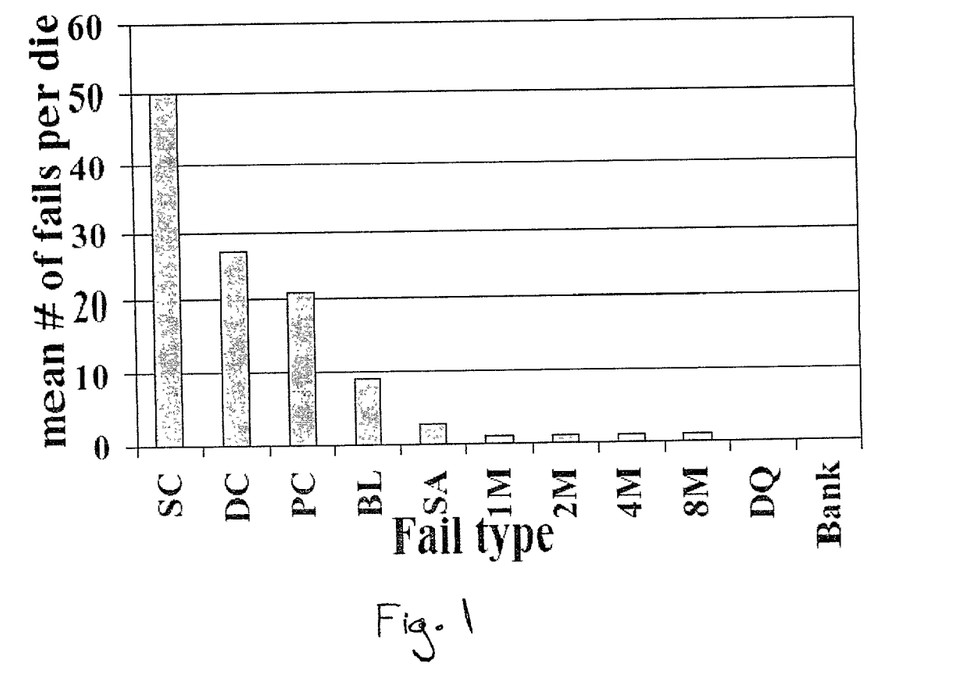
FIG. 1 is a pareto showing stress induced memory fails.

During a typical test flow for semiconductor memories low temperature and high temperature burn-in tests are done after assembly. Burn-in is the process of stressing a memory device to expose faulty memory cells, e.g., to make faulty memory cells fail. During burn-in a small number of new fails are induced and detected. An example of a pareto chart is shown in FIG. 1. Low and high temperature testing finds any remaining temperature and speed specific fails. To improve yields these fails can be analyzed to determine the process root cause. A bit fail map gives the fail location and fail type to perform successful physical failure analysis at the failed site. Due to cost constraints and high parallelism in the burn-in oven (tester) and high-speed memory tests, no known bit fail map capability is currently available on component production testers. Therefore, extra engineering equipment is used for analysis. This improves cost but limits the analysis to a small sample site. According to Table 1, testers at different test stages are compared for parallelism, speed and catch RAM size requirements for analysis.

TABLE 1

|  | Wafer Test | Burn-in | Component Test |
| --- | --- | --- | --- |
| Parallelism | 16–64 | 10,000 | 16–256 |
| Cycle Time | 16–32 ns | 40–200 ns | 2.5–10 ns |
| Clock Speed | 62–34 MHz | 25–5 MHz | 400–100 MHz |
| Catch RAM |  | 32 ns RMW cycle, 256 Mbit device |  |
| Size | 2*256*64 Mbit = 32 Gbit | 256*10 k Mbit = 2.5 Tbit | 16*256*256 Mbit = 1 Tbit |

The wafer test shown in Table 1 has low parallelism and low speed and needs less capture memory for full bit maps. Burn-in tests stress a high number of memory devices and therefore would need a larger catch RAM than a wafer test. Component tests run at high-speed and need cheap slow memory in parallel to catch all fails. The catch RAM size adds a substantially to the cost of the test and is therefore often omitted in the manufacturing environment.

Memory testing systems detect memory faults caused by, inter alia, faulty processing, faulty interconnects, timing related failures, etc. According to existing testing techniques for a memory device under test (DUT), a catch-RAM or a vector memory is needed to store the address of each failing bit. Current memory devices can be over sixteen megabytes in size, additionally, memory devices are often tested in parallel to increase the efficiency of the testing, resulting in an increased need for DUT memory. The size of the DUT memory corresponds to the capacity and number of memory devices being tested. Current DUT memory capacities can exceed four Gigabytes.

Current memory sizes may be too large to economically store all fail information. Fail capture systems can test each pin on a memory device. The memory device may be, for example, dynamic random access memory (DRAM), synchronous dynamic RAM (SDRAM), static RAM (SRAM), and Double Data Rate-SDRAM (DDR SDRAM), as well as non-volatile (NV) memory devices such as NV RAM. These memory devices may be part of a memory module, such as, single in-line memory module (SIMM), or dual in-line memory module (DIMM). However, as these memories become larger, the need for DUT memory increases, increasing the expense of the testing system.

Therefore, a need exists for a system and method of classifying faulty memories based on pass/fail information for a portion of an address space.

SUMMARY OF THE INVENTION

According to an embodiment of the present invention, a method is provided for determining a fail string for a device. The method includes determining a test pattern for a portion of an address space wherein the test pattern includes at least one address in the address space and the portion of the address space includes at least one x address and at least one y addresses. The method executes a test a plurality of times for each test pattern, wherein every combination of the test pattern is tested, wherein the combinations include each address held at a first potential for at least a first test and a second potential for at least a second test. The method includes determining a fail string for the device including pass/fail results for the test pattern, and combining the pass/fail results in the fail string.

The portion of the address space to be tested corresponds to a number of addresses comprising each test pattern.

The test pattern includes a single address. The method further includes holding the test pattern at the first potential during a first test, yielding in a pass/fail result, and holding the test pattern at the second potential during a second test, yielding in a pass/fail result.

The method executes the test for the test pattern, wherein the test pattern is a combination of at least one address.

Determining the test pattern further includes determining at least one x address and at least one y address according to a targeted fail type, wherein the targeted fail type is identified using a subset of the addresses in the address space.

The method generates a pseudo compressed bitmap including a plurality of cells, wherein each cell is one of a passing cell and a failing cell. The failing cell manifests itself as a fail in the pass/fail results for every test pattern and the passing cell has at least one pass result for at least one test pattern.

The method includes generating a pareto.

According to an embodiment of the present invention a program storage device is provided readable by machine, tangibly embodying a program of instructions executable by the machine to perform method steps for generating a pseudo compressed bitmap for a device. The method determines a test pattern for a portion of an address space wherein the test pattern includes at least one address in the address space and the portion of the address space includes at least one x address and at least one y addresses. The method includes executing a test a plurality of times for each test pattern, wherein every combination of the test pattern is tested, wherein the combinations include each address held at a first potential for at least a first test and a second potential for at least a second test. The method further includes determining a fail string for the device including pass/fail results for the test pattern, and generating a pseudo compressed bitmap by combining each pass/fail result according to a Boolean AND function.

The portion of the address space to be tested corresponds to a number of addresses comprising each test pattern.

The test pattern includes a single address. The method includes holding the test pattern at the first potential during a first test, yielding in a pass/fail result, and holding the test pattern at the second potential during a second test, yielding in a pass/fail result.

The method executes the test for the test pattern, wherein the test pattern is a combination of at least one address.

Determining the test pattern further includes determining at least one x address and at least one y address according to a targeted fail type, wherein the targeted fail type is identified using a subset of the addresses in the address space.

The pseudo compressed bitmap includes a plurality of cells, wherein each cell is one of a passing cell and a failing cell. The failing cell manifests itself as a fail in the pass/fail results for every test pattern and the passing cell has at least one pass result for at least one test pattern.

According to an embodiment of the present invention a method is provided for generating a pseudo compressed bitmap for a device. The method includes generating a pseudo compressed bitmap by combining a plurality of pass/fail results according to a Boolean AND function. The method displays the pseudo compressed bitmap wherein the pass/fail results correspond to at least one X address pin and one Y address pin, and wherein each address pin corresponds to a plurality of pass/fail results.

Every combination of a test pattern, including at least one address, is tested, wherein the combinations include each address held at a first potential for at least a first test and a second potential for at least a second test.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

The present invention describes a method for generating fail type and fail location data for all failing chips in a manufacturing environment. The method determines a test pattern for a portion of an address space. The test pattern includes at least one address in the address space. The portion of the address space includes at least one x address and at least one y address. Each address corresponds to an address pin on a memory device. The method determines a fail string for the device including pass/fail results for each test pattern. Every combination of the test pattern is tested, wherein the combinations include each address held at a first potential for at least a first test and a second potential for at least a second test. For a test pattern including one address, each address is tested once while being hold at a first potential and once while being held at a second potential. A pseudo compressed bitmap is generated by combining the pass/fail results according to a Boolean AND function. The size of the pseudo compressed bitmap will vary with the scope of the address space and the number of addresses in the test pattern.

A starting point is a fail pareto, illustratively shown in FIG. 1. Every fail category has a characteristic number of failing cells in a particular spatial pattern. Table 2 gives an overview of the fail type, shape and number of failing cells. The maximum number of fails per category would suggest using a vector memory or a compressed bit fail map for fail address collection. However, block fails need large vector memories and manufacturing test equipment may not be practical for high parallel compressed bit fail maps. Therefore, the present invention provides methods for overcoming these limitations and enabling a detailed analysis on high volume data.

TABLE 2

|  |  | Size | | Repeat | |
| --- | --- | --- | --- | --- | --- |
|  | Description | X | y | x | y |
| SC | Single Cell | 1 | 1 | 1 | 1 |
| DC | Double Cell | 2 | 1 | 1 | 1 |
| PC | Paired Cell | 1 | 2 | 1 | 1 |
| BL | Bit Line | 512 | 1 | 512 | 1 |
| SA | Sense Amplifier | 1 k | 1 | 512 | 1 |
| 1 M | 1 Mbit Block | 512 | 2 k | 512 | 2 k |
| 2 M | 2 Mbit Block | 1 k | 2 k | 1 k | 2 k |
| 4 M | 4 Mbit Block | 2 k | 2 k | 2 k | 2 k |
| 8 M | 8 Mbit Block | 4 k | 2 k | 4 k | 2 k |
| DQ | Data Block | 8 k | 2 k | — | — |
| Bank | Bank | 8 k | 2 k | 8 k | 2 k |
| WL | Word Line | 1 | 2 k | 1 | 2 k |
| WL WL | WL/WL Short | 2 | 2 k | 1 | 2 k |

In manufacturing environments having high production volume and testers without catch RAM for component tests, diagnosis can be difficult. These systems produce a limited number of fail categories and a small number of failing cells on which to generate the data needed for a fail pareto and physical failure analysis. The present invention provides methods for use in these manufacturing environments and elsewhere. One method uses one test pattern a number of times for selected address ranges, while using the pass/fail information for each test to categorize the fail for a pareto or generate pseudo bit fail maps for visualization.

The method includes a number of test steps each generating pass or fail information for part of the memory array. The versatility of the present invention for the above mentioned fail types is shown. Variations of the scheme for physical failure analysis or subsets of fail types are discussed and an illustrative example for a production case is given.

It is to be understood that the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and micro instruction code. The various processes and functions described herein may either be part of the micro instruction code or part of the application program (or a combination thereof) which is executed via the operating system. In addition, various other peripheral devices may be connected to the computer platform such as an additional data storage device and a printing device.

It is to be further understood that, because some of the constituent system components and method steps depicted in the accompanying figures may be implemented in software, the actual connections between the system components (or the process steps) may differ depending upon the manner in which the present invention is programmed. Given the teachings of the present invention provided herein, one of ordinary skill in the related art will be able to contemplate these and similar implementations or configurations of the present invention.

The pseudo bit map generation involves the repetition of the same test pattern, while generating pass/fail information for a limited address space within the array. Different address limitations and test patterns generate fail strings having different scopes, and thus can be tailored to a specific application.

Figure 2:
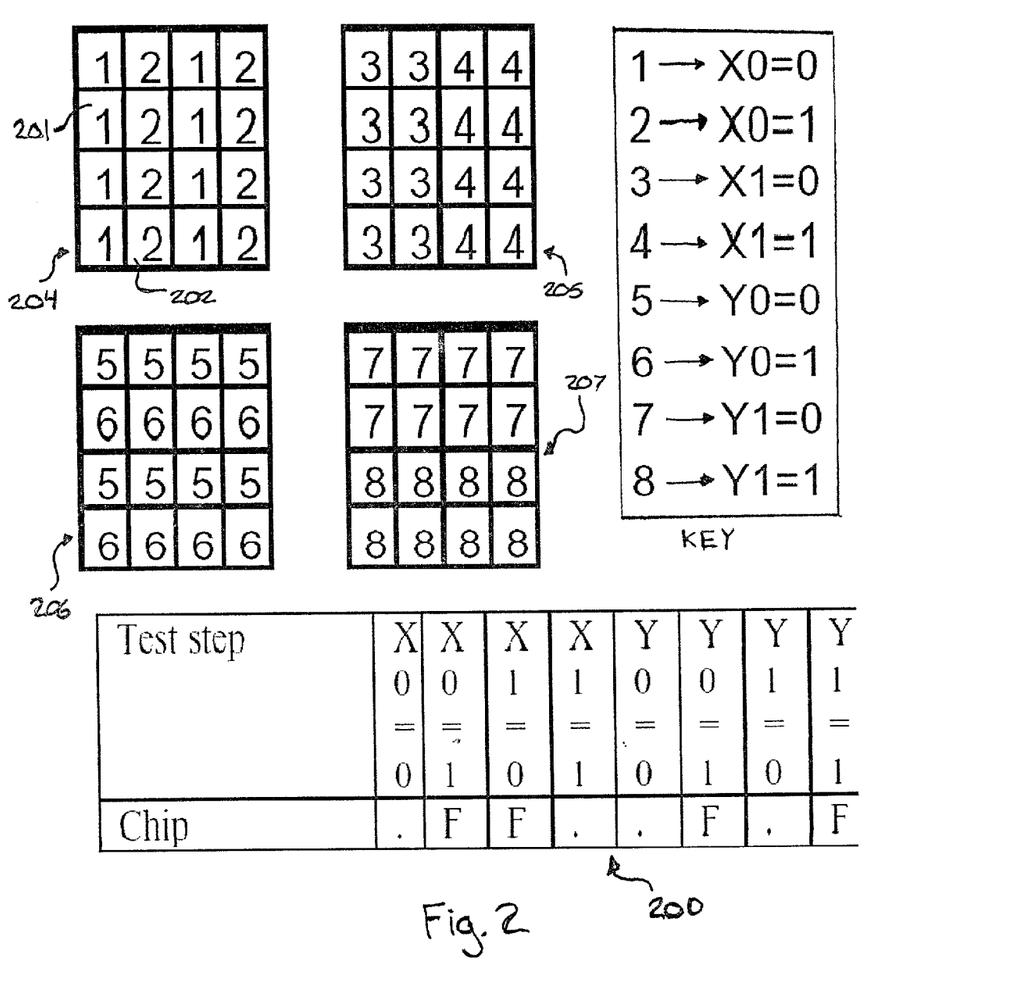
FIG. 2 illustrates a 4×4 memory tested in eight steps and a resulting fail string according to an embodiment of the present invention.

A memory device has x x-addresses, including bank addresses, and y y-addresses is able to address $2^{(x+y)}$ memory cells. According to one embodiment of the present invention, only a part of a memory array is tested by limiting the data strobe at read operations, where one or more selected addresses are fixed at 0 or 1. Since the full array is to be tested, the pattern is duplicated for all address combinations. FIG. 2 shows all address combinations for a 4×4 device with two x addresses (x0 and x1) and two y addresses (Y0 and Y1) and eight test steps including a corresponding pass/fail string 200. The pass/fail string 200 shows, for every test, a pass (.) or fail (F). For address X0 in the first combination 204, X0=0 is shown as 1 labeled with numeral 201 and X0=1 is shown as 2 labeled with numeral 202. When each combination 204 to 207 is superimposed upon one-another, all of the possible address combinations are shown for the 4×4 device. Further, by assigning a pass or a fail to each number, one through 8, according to the pass/fail string 200, and applying an AND function to the superimposed combinations, e.g., 1, 3, 5, 7 for the upper left of each combination, a bit fail map can be generated. For example, the superimposed combination 1 (.), 3(F), 5(.), 7(.) yields a pass according to the Boolean operation AND for the bit corresponding to that combination.

Starting with the fail types from Table 2 above, the minimum number of addresses needed to distinguish these fail types can be seen in Table 3:

TABLE 3

|  |  | Address | |
| --- | --- | --- | --- |
| Description | | x | Y |
| SC | Single Cell | x(n < 8) | y(n < 11) |
| DC | Double Cell | x0 | y(n < 11) |
| PC | Paired Cell | x(n < 8) | y0 |
| BL | Bit Line | x(n < 8) | y0 |
| SA | Sense Amplifier | x8 | y(n < 11) |
| 1 M | 1 Mbit Block | x8 | y(n < 11) |
| 2 M | 2 Mbit Block | x9 | y(n < 11) |
| 4 M | 4 Mbit Block | x10 | y(n < 11) |
| 8 M | 8 Mbit Block | x11 | y(n < 11) |
| DQ | Data Block | x11 | y10 |
| Bank | Bank | x12 | y11 |
| WL | Word Line | x0 | y(n < 11) |
| WL WL | WL/WL Short | x0, x1 | y(n < 11) |

Figure 3A:
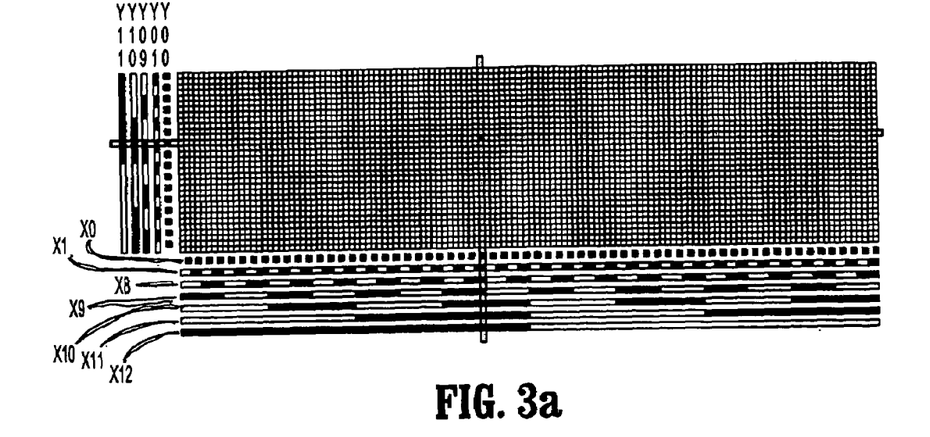
FIGS. 3*a*–3*c* show pseudo compressed bitmaps for a single cell fail, a word line fail, and bit line fail, respectively, according to an embodiment of the present invention.
Figure 3B:
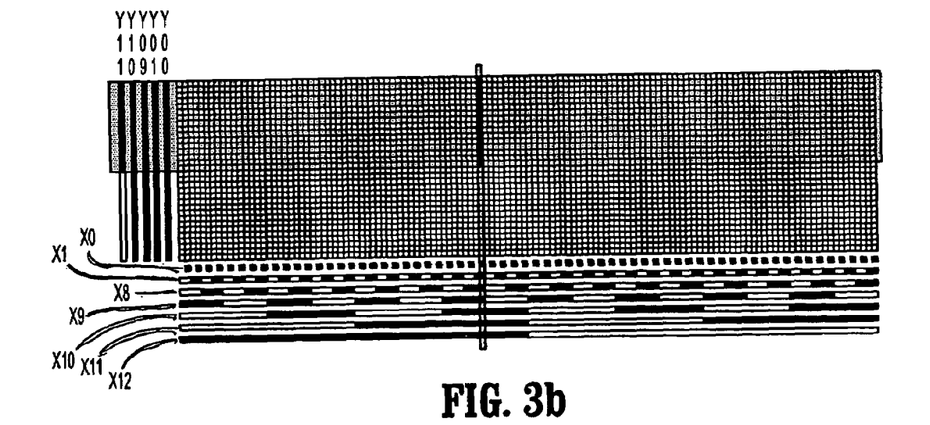
Figure 3C:
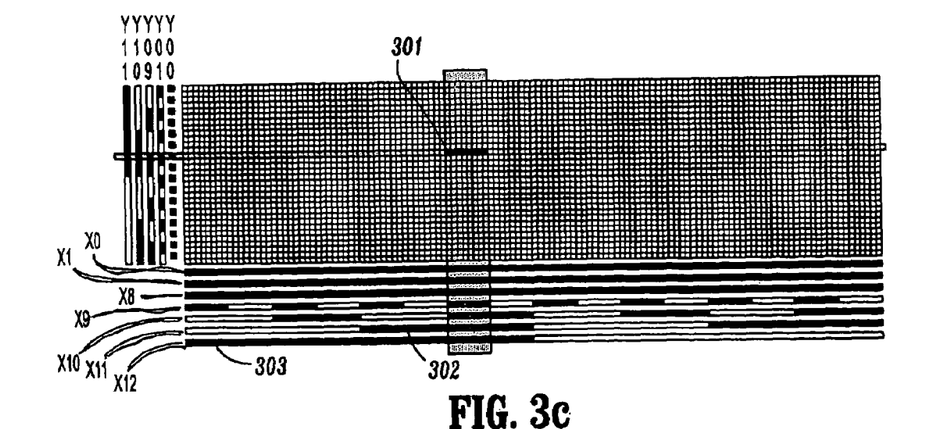

To identify all given fail types the minimum number of x addresses and y addresses are listed: X0, X1, X8, X9, X10, X11, X12, Y0, Y1, Y9, Y10, Y11. These twelve addresses correspond to 4096 cells ($2^{12}$=4096), as shown in FIG. 3.

One approach tests each of the twelve addresses (a test pattern including one address) two times, while holding each address once low and once high. This results in 2*12 test steps and gives 24 pass/fail results which code for the 4096 cells. Table 4 illustratively shows fail strings for different fail types, wherein the header information in the table gives an address, for example, X0 (X00) or X1 (X01), and the state (high or low e.g., 1 or 0) for that address.

TABLE 4

| ADDRESS | STATE | Chip 1 | Chip 2 | Chip 3 | Chip 4 | Chip 5 | Chip 6 | Chip 7 | Chip 8 | Chip 9 | Chip A | Chip B | Chip C | Chip D |
| --- | --- | --- | --- | --- | --- | --- | --- | --- | --- | --- | --- | --- | --- | --- |
| X00 | 0 | . | F | . | F | F | F | F | F | F | F | F | . | F |
| X00 | 1 | F | F | F | F | F | F | F | F | F | F | F | F | F |
| X01 | 0 | . | . | . | F | F | F | F | F | F | F | F | . | . |
| X01 | 1 | F | F | F | F | F | F | F | F | F | F | F | F | F |
| X08 | 0 | . | . | . | F | F | F | F | F | F | F | F | . | . |
| X08 | 1 | F | F | F | F | F | F | F | F | F | F | F | F | F |
| X09 | 0 | F | F | F | F | F | F | F | F | F | F | F | F | F |

TABLE 4-continued

| ADDRESS | STATE | Chip 1 | Chip 2 | Chip 3 | Chip 4 | Chip 5 | Chip 6 | Chip 7 | Chip 8 | Chip 9 | Chip A | Chip B | Chip C | Chip D |
|---|---|---|---|---|---|---|---|---|---|---|---|---|---|---|
| X09 | 1 | . | . | . | . | F | . | F | F | F | F | F | . | . |
| X10 | 0 | . | . | . | . | . | . | . | F | F | F | . | . | . |
| X10 | 1 | F | F | F | F | F | F | F | F | F | F | F | F | F |
| X11 | 0 | . | . | . | . | . | . | . | . | F | . | F | . | . |
| X11 | 1 | F | F | F | F | F | F | F | F | F | F | F | F | F |
| X12 | 0 | F | F | F | F | F | F | F | F | F | F | F | F | F |
| X12 | 1 | . | . | . | . | . | . | . | . | F | F | F | . | . |
| Y00 | 0 | F | F | F | F | F | F | F | F | F | F | F | F | F |
| Y00 | 1 | . | . | F | . | . | F | F | F | F | F | F | F | F |
| Y01 | 0 | F | F | F | F | F | F | F | F | F | F | F | F | F |
| Y01 | 1 | . | . | . | . | . | F | F | F | F | F | F | F | F |
| Y09 | 0 | . | . | . | . | . | F | F | F | F | F | F | F | F |
| Y09 | 1 | F | F | F | F | F | F | F | F | F | F | F | F | F |
| Y10 | 0 | . | . | . | . | . | F | F | F | F | . | F | F | F |
| Y10 | 1 | F | F | F | F | F | F | F | F | F | . | F | F | F |
| Y11 | 0 | F | F | F | F | F | F | F | F | F | F | F | F | F |
| Y11 | 1 | . | . | . | . | . | . | . | . | . | F | . | . | . |
|  |  | 12 | 13 | 13 | 15 | 16 | 19 | 20 | 21 | 22 | 22 | 22 | 16 | 17 |
|  |  |  |  |  |  |  | 1 | 2 | 4 | 8 |  |  |  |  |
|  |  | SC | DC | PC | BL | SA | M | M | M | M | DQ | Ba | WL | WW |

It can be seen that some fail types have the same number of fails in the string, however these can be distinguished according to the affected addresses, e.g., Y9. A fail count alone for a given test is not sufficient to determine the exact fail signature. From the fail string a pseudo compressed bit map can be generated. FIGS. 3a–3c show a pseudo bit fail map generated by Chip1, ChipC, and Chip4 fail strings from Table 4, respectively. The failing region, e.g., 301 is determined by combining the fail areas, e.g., 302 and 303, for every address, both X and Y. The bit fail map helps the user to visualize failures. Spatial information can help to identify systematic problems in certain areas. Wafer maps, reticle maps or lot maps can be generated. The algorithm to generate these maps will be presented later.

Figure 4:
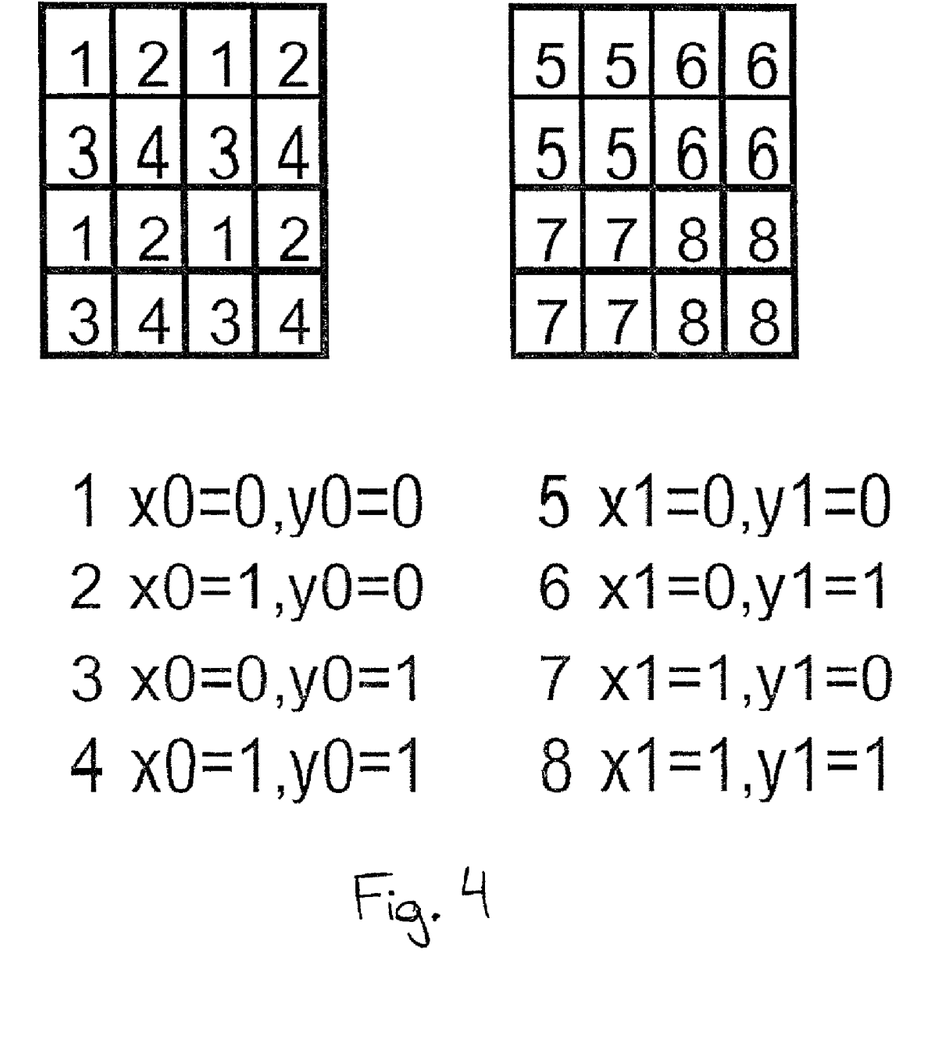
FIG. 4 illustrates a 4×4 memory tested in eight steps with two fixed addresses according to an embodiment of the present invention.

This approach works well in the presence of single fail types per chip. Increasing the number of tests to the full address range even provides the location for physical failure analysis. The approach can be tuned, e.g., two addresses may be combined in the test pattern. Instead of testing half the chip by holding one address at a time, a quarter of the chip is tested holding two addresses simultaneously at predefined values. For example, instead of testing X0=0, X0=1, X1=0, Y1=1, the test sequence (X0,X1=00), (X0,X1=01), (X0,X1=10), (X0,X1=11) is chosen. FIG. 4 is an illustrative example, wherein 8 test steps are performed for a 4×4 device with 2 fixed addresses. No test time increase is involved over the example shown in FIG. 2, but an indication of the presence of more than one fail can be recognized.

If test time is not an issue, or more detailed fail information is needed, then the test pattern can include more than two addresses. If the test pattern includes four addresses, sixteen test steps need to be performed. If an overlap of the addresses is taken into account, even more than one fail can be exactly mapped. This scheme is useful for parallel test systems, since catch RAM cost can be high and test time per device is low due to parallelism.

If the test pattern is modified with the x and y range and step size, only part of the memory is written and read. This improves total test time, since run time for each test is shorter than the initial full test. Some coupling mechanisms from cell to cell or line to line may not be covered. The fail string will generate no fails for certain addresses due to missing coupling conditions. Using the original pattern and modifying only the strobe-for-read-operation maintains all coupling conditions between memory cells.

The fail string data, generated by the above mentioned method can be processed for fail category analysis, fail address or to create bit fail maps. Fail categories can be stored in a database for all hardware in a manufacturing environment and line monitoring can be performed. Fail signatures are also important for process experiments targeting certain fail mechanisms. Bit fail maps are used to get a visualization to identify and communicate process problems easier. First strategies for fail category analysis will be presented and then strategies for fail bit map generation are discussed.

Fail categorization takes the number of occurrences of 'F's in the complete fail string or only at certain positions into account. Table 4 lists the number of 'F's for each fail category. Large area fails like BLs are identified by the number of 'F's for x addresses lower than address X9. Another possibility is to use a simple pattern comparison at certain positions of the fail string to classify the fail type.

For bitmap generation all fail addresses have to be generated. For very large memory sizes and low number of failing cells, it is not useful to generate a full bitmap. An overview and a second zoomed map can be generated to reveal addition details. This can also be seen in the examples of reference, To generate the addresses, the fail string is read sequentially. If 'F's occur, either the relating bit position at the address is set to the tested address value, or if a fail occurs for both address '0' and '1', more than one address is failing and a second subtask for a second fail address has to be generated. For compressed pseudo bit fail maps only sub strings of the test sequence are used. An example is the WL fail from Table 4 (ChipC), shown in Table 5:

TABLE 5

| ADDRESS | STATE | Chip C |
|---|---|---|
| X00 | 0 | . |
| X00 | 1 | F |
| X01 | 0 | . |
| X01 | 1 | F |
| X08 | 0 | . |
| X08 | 1 | F |
| X09 | 0 | F |

TABLE 5-continued

| ADDRESS | STATE | Chip C |
|---------|-------|--------|
| X09 | 1 | . |
| X10 | 0 | . |
| X10 | 1 | F |
| X11 | 0 | . |
| X11 | 1 | F |
| X12 | 0 | F |
| X12 | 1 | . |
| Y00 | 0 | F |
| Y00 | 1 | F |
| Y09 | 0 | F |
| Y09 | 1 | F |
| Y10 | 0 | F |
| Y10 | 1 | F |
| Y11 | 0 | F |
| Y11 | 1 | . |
|  |  | 16 WL |

Figure 5:
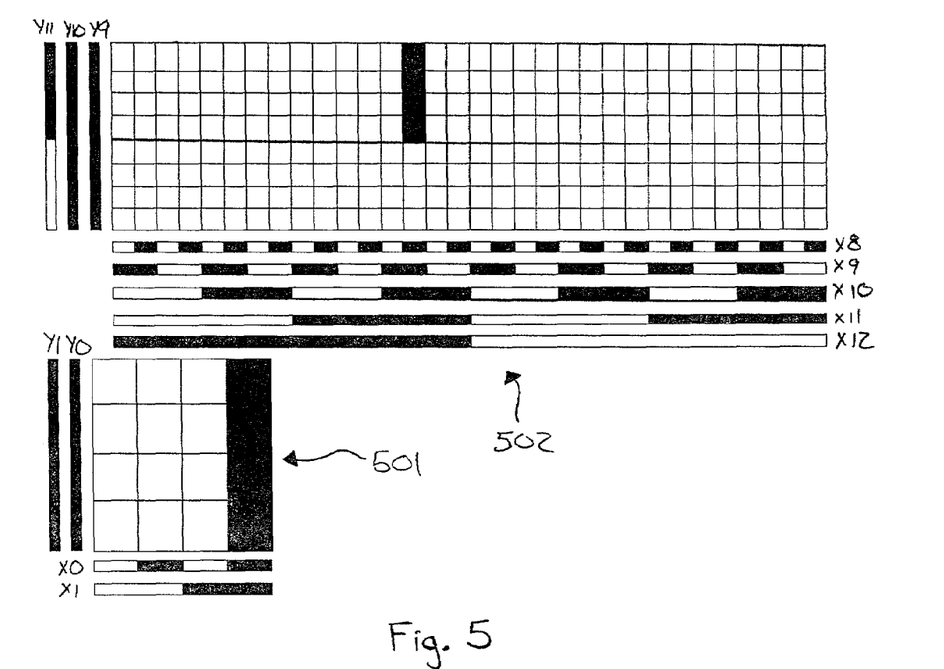
FIG. 5 is a split pseudo bitmap for a word line fail according to an embodiment of the present invention.

The fail string generates for X0, where '0' is passing and '1' is failing, for the fail address X0=1. Since a WL has more than one cell failing certain addresses, for example, Y0, will fail regardless, whether they are held high or low. In the address this can be expressed by a '-'. A short form of the failing addresses can be given by (y,x)=(0 - - - , 0110111). For every '-' 2 fail address are generated resulting in a total of 2*2*2*2=16 failing cells in a pseudo bit fail map. The full bit fail map with these addresses would be $2^{12}$=4096 pixels large. For visualization, it is better to partition the picture into 2 maps (see FIG. 5), a first map 501 for the details using x0, x1, y0, y1 and a second map 502 for the global overview using x8, x9, x10, x11, x12 and Y9, Y10, Y11.

Figure 6:
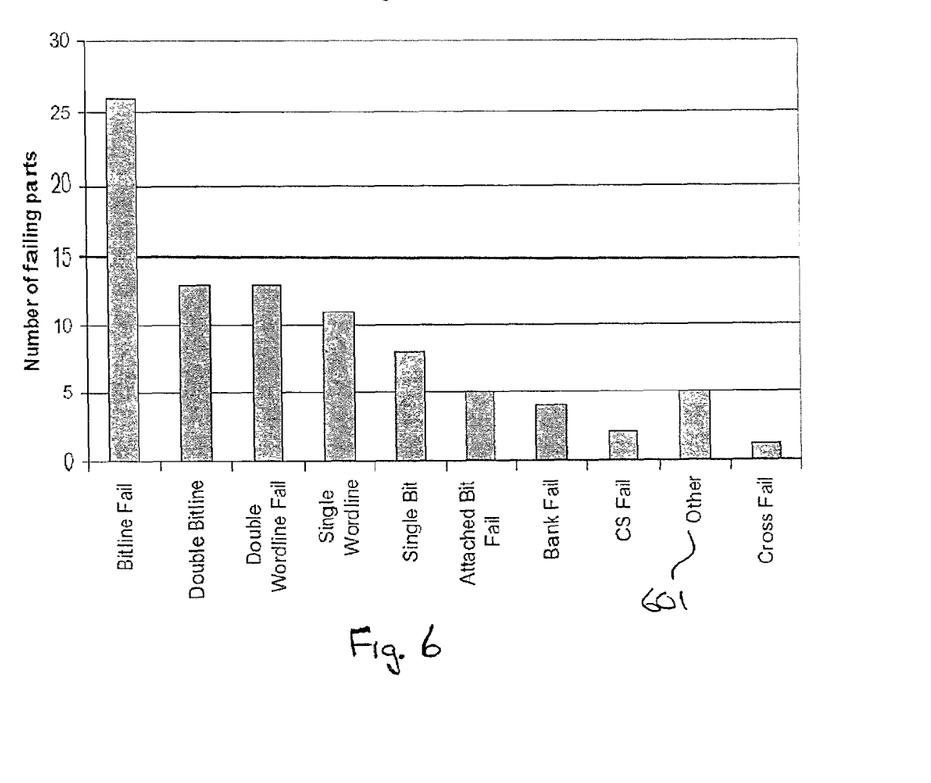
FIG. 6 is a pareto of burn-in fails generated with a fail string according to an embodiment of the present invention.

To prove the versatility of the present invention for a 256 Mbit SDRAM in x8 configuration burn-in fails were tested on a production test. In a first approach addresses x0, x1, x2, x10, x11, y0, y1, y2, y6 and the bank addresses were used. Testing 243 devices 78% of the fail signatures were correctly identified, 5% were put into the wrong category and 17% could not identified be classified. To improve the result the testing scheme was modified. Two 4×4 matrixes were used employing X0, X1, Y0, Y1 and X2, X10, Y9, Y4, and each of the four banks was tested independently. This results in 4*(16+16)=128 tests, which run in under 4 minutes on an Advantest® test system. Fourteen different test signatures were defined and the fail string analyzed for each test. To evaluate the results the same components were tested generating full bit fail maps and the results were compared. For a sample of 243 parts, 236 fails were identified correctly (97%) and 7 (3%) fails could not be recognized. There were no wrongly categorized fails. As shown in FIG. 6, on a second run another 88 parts were tested. Five parts had multiple fails and could not be categorized 601.

This example shows how the pseudo compressed bit fail map scheme works in a manufacturing environment. The test time is reasonable, while still being able to identify fail types. Burn-in induces mostly single fail types (97%), so the proposed scheme works perfectly. Depending on the fail types the address scheme has to be optimized, as shown in the manufacturing example. Even with the simple scheme high identification rates are possible.

The pseudo bit fail map approach can be compared to a vector memory. The pseudo bit fail map can be either realized as a sequence of test patterns, or in hardware as a number of latches, for every address bit two latches, one for the address being '1' and one for the address being '0'. If a fail during test occurs, all latches for the state of the corresponding address bits will be set. The number of patterns for the pseudo bit fail equals the number of latches to realize the scheme in hardware. Using a hardware approach all fails can be saved in the latches during a single pattern. The pseudo bit fail map approach can therefore be realized in hardware, for memory testers or Built-In-Self-Test (BIST) schemes. Therefore, the pseudo bit fail map can be compared to a vector memory. An example of a vector memory for fail capturing in a BIST can be found in I. Schanstra et al., "Semiconductor Manufacturing Process Monitoring Using Built-In Self-Test for Embedded Memories", *Proceedings of the International Test Conference*, Washington D.C., 1998, pp. 872–881.

A vector memory saves all fail addresses during the pattern run time. A fail address will be saved each time the failing cell is read, filling the vector memory quickly. Additional circuitry can compare the current address with all stored addresses and prevent this. Schanstra et al. uses two kinds of memories for storage of the fails: a column memory and a single cell address memory together with some fail flags, an additional fail counter; and associative memory to prevent storing the same address more than once. The column memory is limited to four column addresses and the single cell address to eight full addresses. For a 256 kbit part with 512 columns (9 address bits) and 512 rows a minimum number of 4*9+8*(9+9)=180 latches are needed to store the fail location. For a simple pseudo bitmap a minimum of 2*18=36 latches and some decoding logic is needed. The pseudo bitmap approach needs less hardware.

The vector memory in this case is optimized for column fails, and single cells. It can identify more than one single cell or more than one column fail. Large area fails like 1 M segments or 4M segments or WLs will not be distinguished. The vector memory together with the associative memory has an advantage for multiple-column or single cell fails compared to the pseudo bit fail map approach. The scheme of the pseudo bit fail map can be improved with increasing number of tests or more catch RAM, to allow multiple fail classification.

Figure 7:
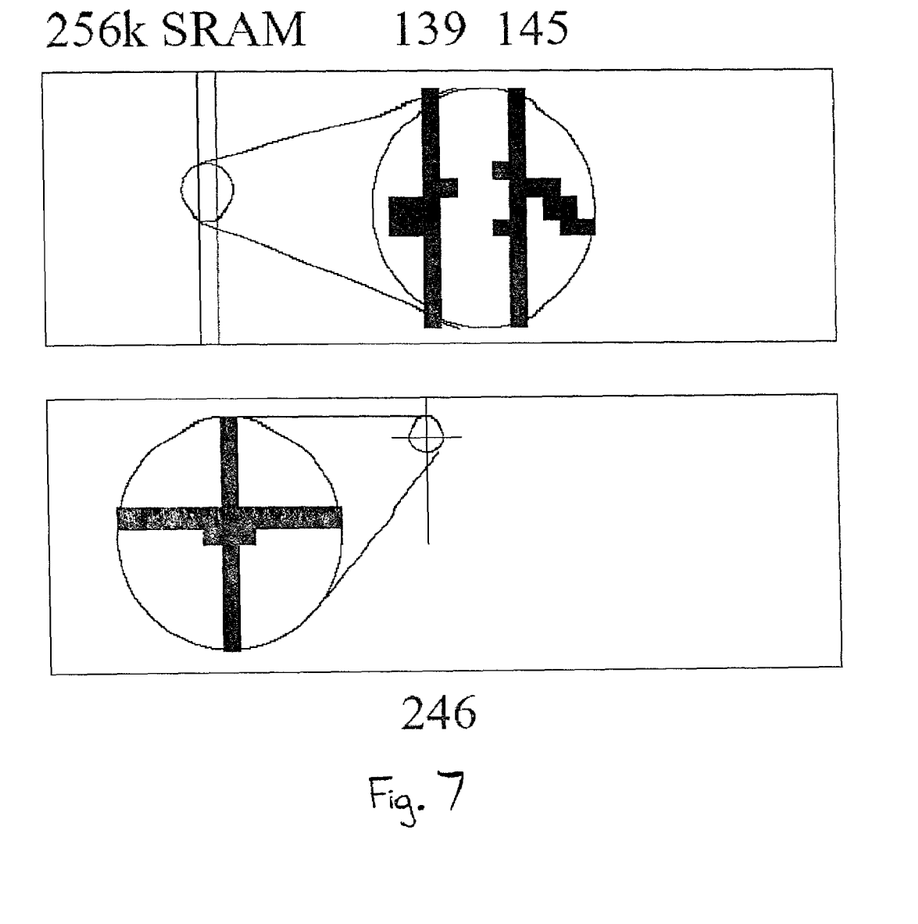
FIG. 7 shows examples of bit fail maps.
Figure 8:
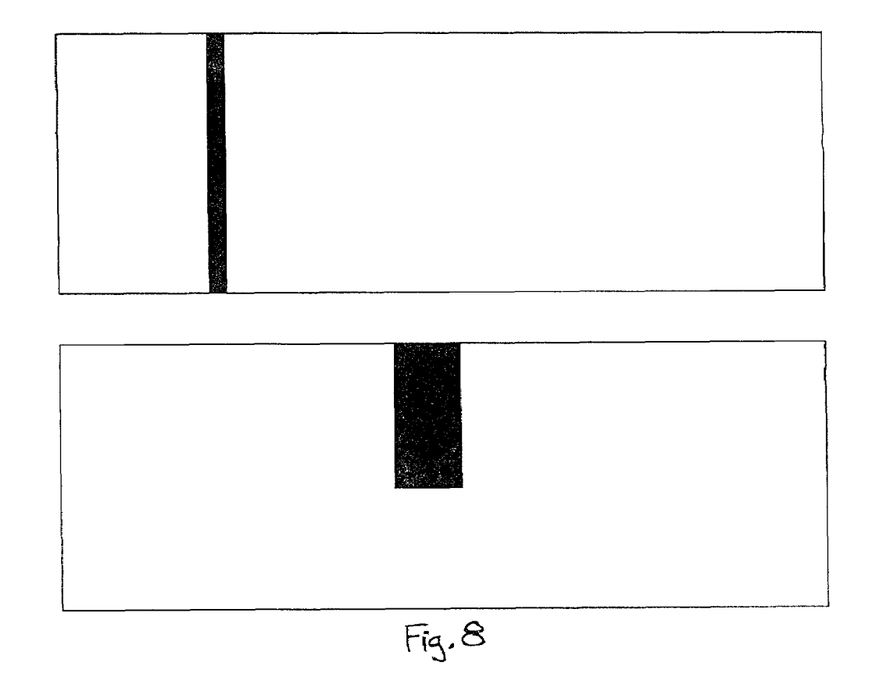
FIG. 8 shows examples of pseudo bit fail maps according to an embodiment of the present invention.

The fails of FIG. 7 will be evaluated with the pseudo bit fail map approach. One approach generates two pass/fail results for every address. FIG. 8 shows the resulting bit fail map.

Figure 9:
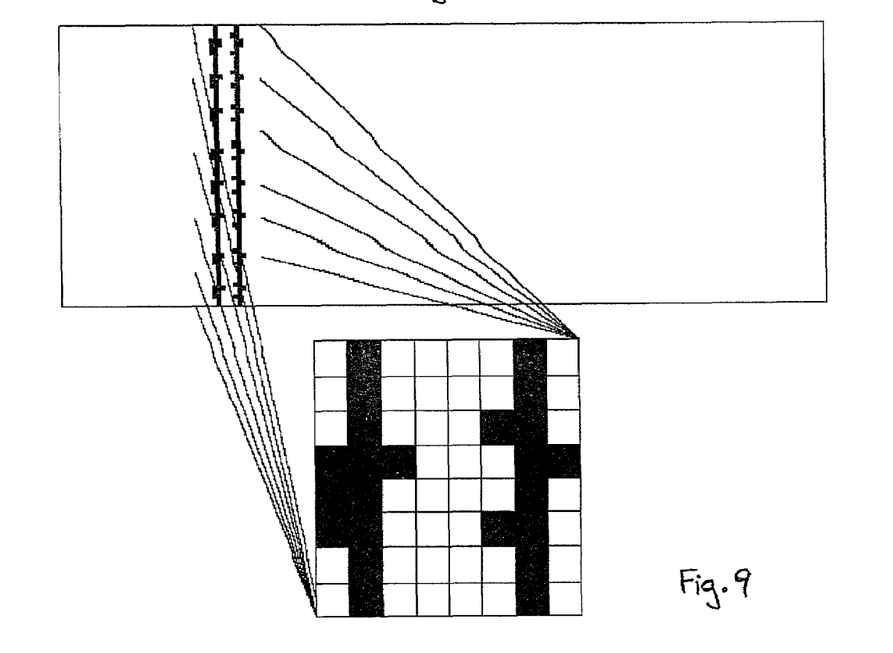
FIG. 9 shows examples of an extended pseudo bit fail map.

It can be seen that cross fails expand in the x and y directions and detailed information is lost. One proposed solution to this is, for example, for a 256 k SRAM the test sequence can be expanded in a first step testing the lower three x addresses and three y addresses together. This results in $2^3*2^3$=8*8=64 tests instead of twelve tests. Additionally, 52 latches are needed, giving a total of 88 latches. The 64 latches, each having a certain x0, x1, x2, y0, y1, y2 combination gives an 8×8 pixel resolution of the fail, but this pattern repeats every eight pixels. As shown in FIG. 9, the fail signature can be exactly determined, but the exact fail location cannot be calculated.

Figure 10:
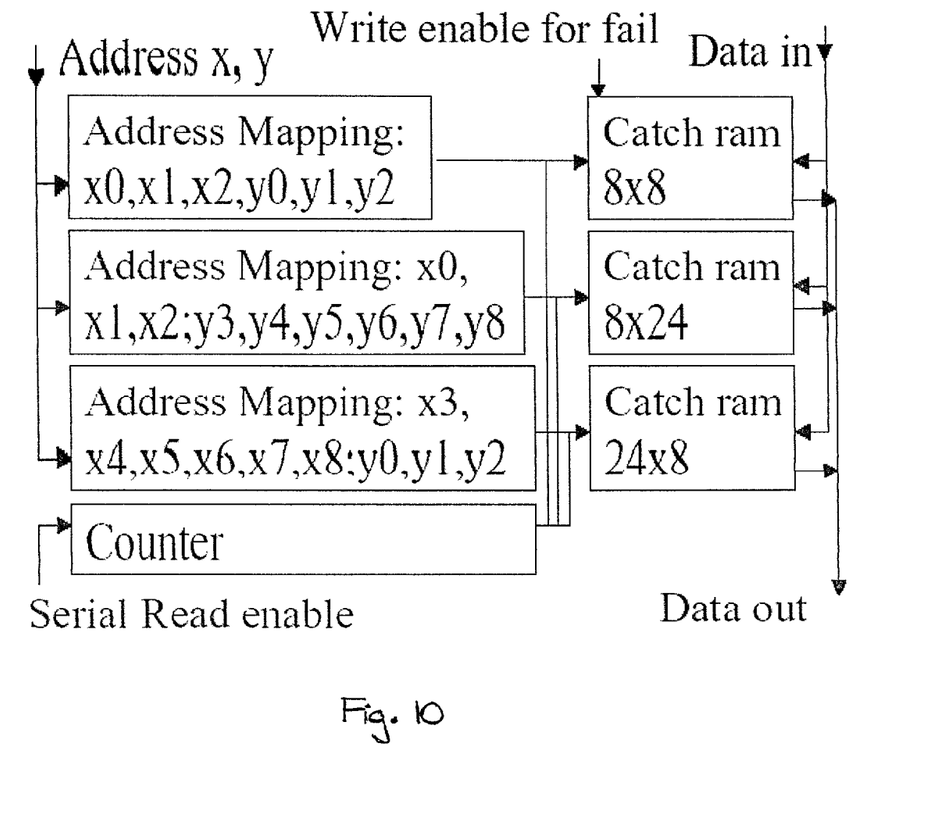
FIG. 10 is an illustration of a circuit for generating a compressed pseudo bit fail map according to an embodiment of the present invention.

To improve the resolution, low order x addresses can be combined with y addresses and vice versa, for example, the addresses x0, x1, x2, y0, y1, y2 are combined resulting in 64 tests. For y3..y8 every address is combined with a certain triple x0, x1, x2. This results in 6*2*8=96 tests. Similarly, the addresses x3..x8 are combined with the triple y0, y1, y2. A circuit realization for these combinations is shown in FIG. 10.

The circuit realization for the extended pseudo bit fail map uses the x and y addresses and the pass or fail information as input. There are three memory arrays each having a matrix to select a Boolean term or address mapping for the small catch RAM arrays. The three catch RAM arrays are written in parallel during the testing. For pass or fail readout the catch RAM information can be serially transferred out of the chip.

In total 64+8*12*2=246 latches are used. As described above three small maps will be generated. Every point on the small maps represents one test step or one catch RAM location. The maps with the used addresses are
1) x0, x1, x2; y0, y1, y2 (8*8=64)
2) x0, x1, x2; y3, y4, y5, y6, y7, y8 (8*24)
3) x3, x4, x5, x6, x7, x8; y0, y1, y2 (24*8)

Figure 11:
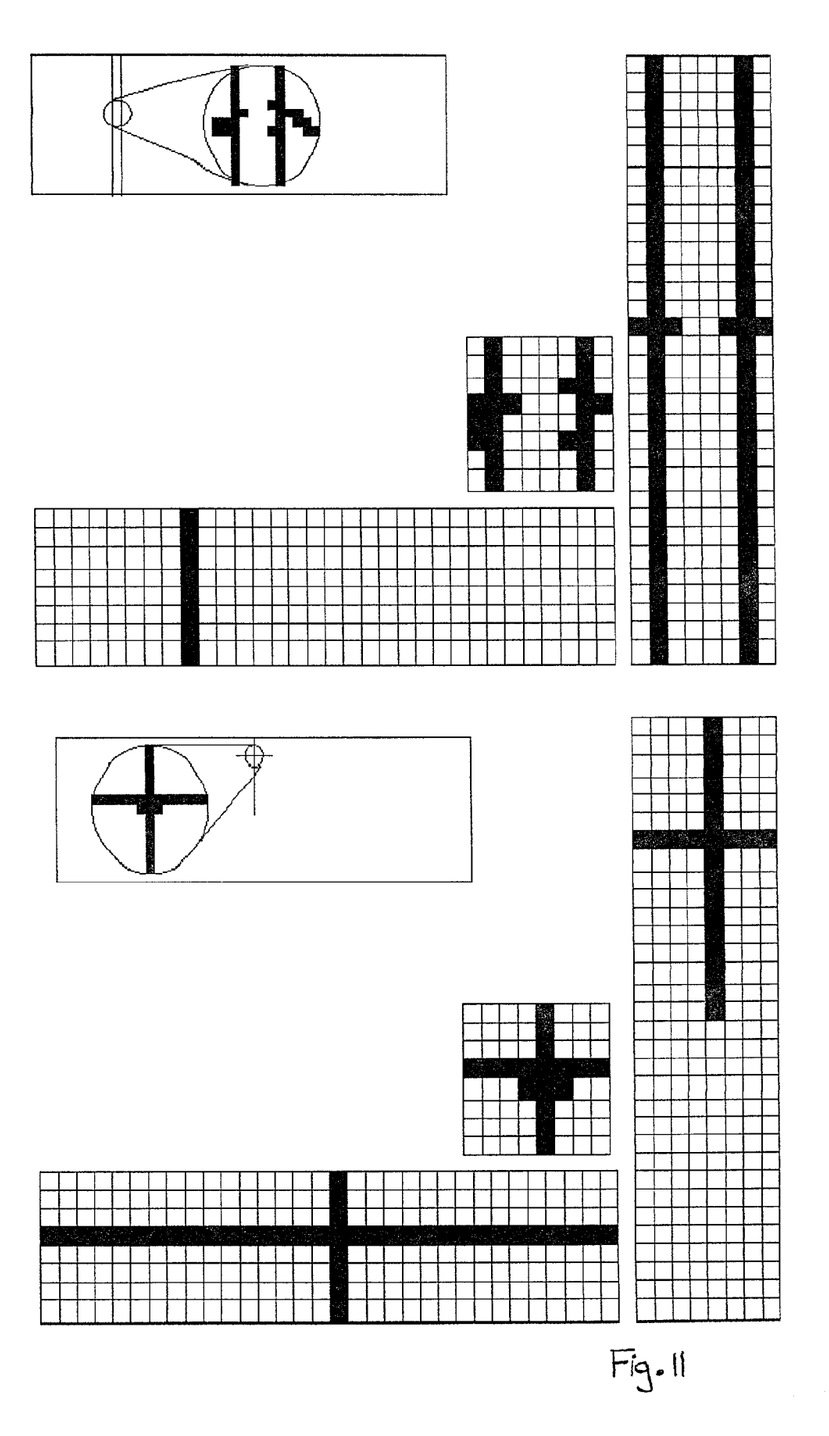
FIG. 11 shows examples of extended pseudo bit fail maps.
Figure 12:
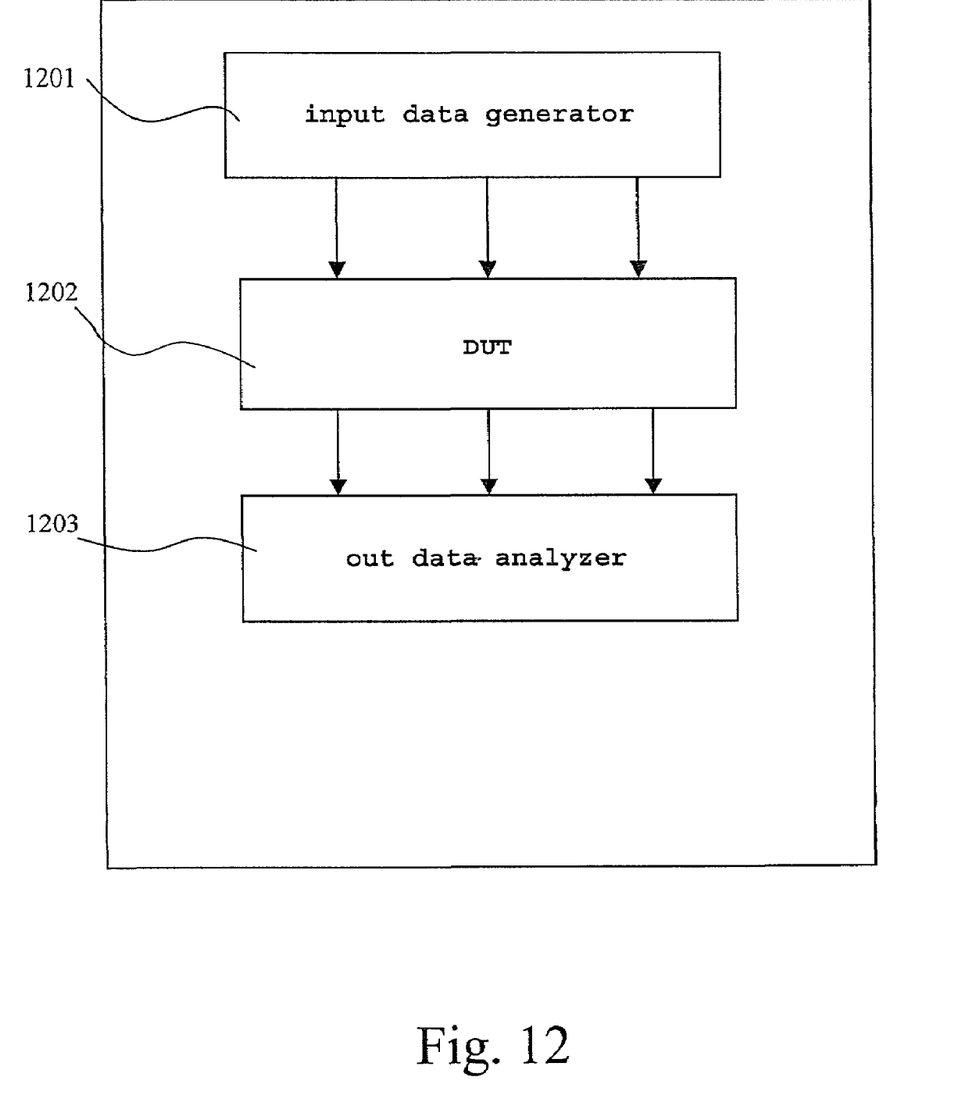
FIG. 12 is a block diagram of the hardware according to an embodiment of the present invention.

FIG. 11 shows an exact pseudo bit fail. The resulting scheme allows now identifying more than one fail. A single cell can be categorized by one failing cell surrounded by passing cells, up to sixteen single cells can be recognized in the small 8×8 matrix. Referring to FIG. 12, the hardware needs are comparable to the BIST solution, including an address data generator 1201, connected to the devise 1202 or devices under test (DUT), and output data analyzer 1203. The input data generator 1201 inputs addresses, data and control signals to the memory 1202. The out data analyzer 1203 evaluates data outputs from the memory 1202 during read operations to determine the pass/fail string.

Figure 13:
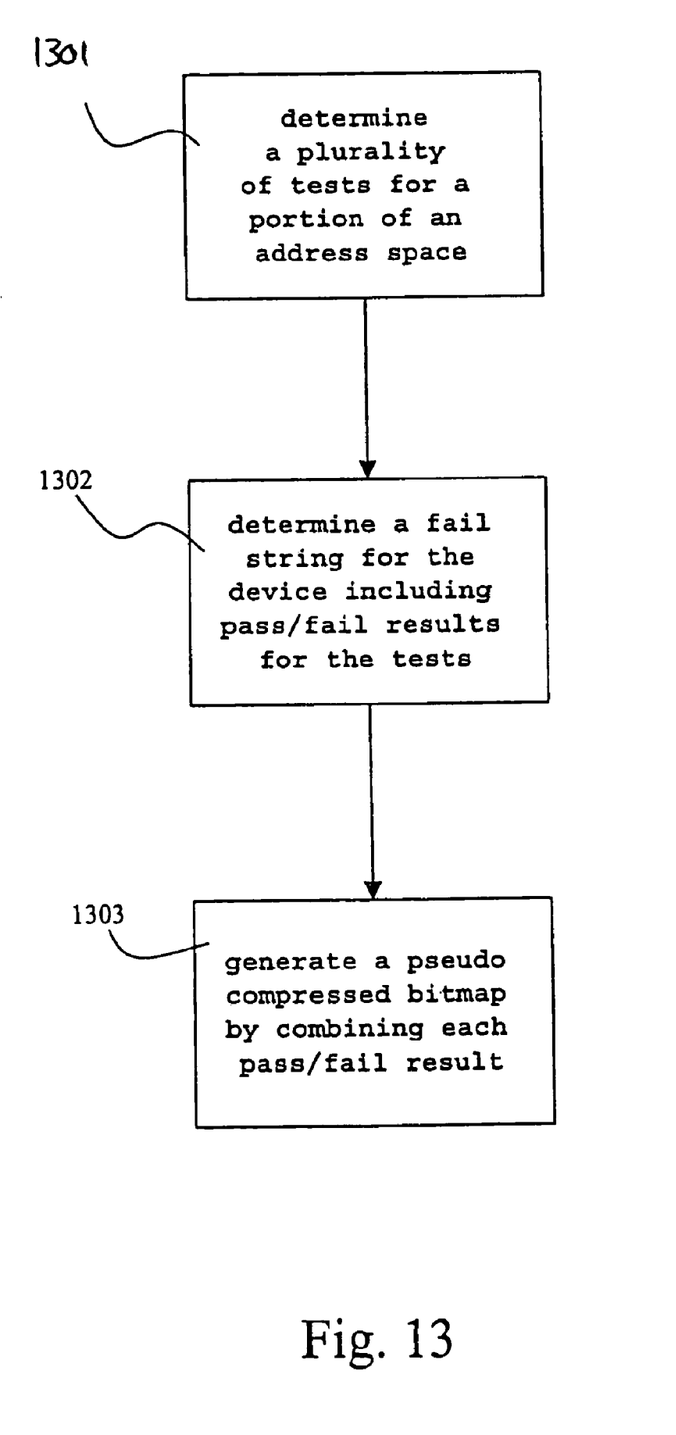
FIG. 13 is a flow diagram according to an embodiment of the present invention.

The present invention provides a new scheme for generating pseudo bit fail maps and allowing for fail type classification on high parallel test systems. Referring to FIG. 13, the method includes determining a plurality of tests for a portion of an address space 1301, determining a fail string for the device including pass/fail results for the tests 1302, and generating a pseudo compressed bitmap by combining each pass/fail result 1303. The method can be implemented in a BIST situation for diagnosis without having complicated logic to stop the testing for fail information transfer.

Having described embodiments for a method classifying memories based on pass/fail information, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method of determining a fail string for a device comprising the steps of:
   determining a portion of an address space to test for determining an occurrence of a fail type, wherein the portion of the address space comprises at least one x address and at least one y address of the device;
   executing a test pattern that includes at least one address in the address space at least two times for the at least one address, wherein the at least one address is held at a first potential for at least a first test and a second potential for at least a second test;
   determining a fail string for the device including pass/fail results for the test pattern, wherein different subsets of the fail string correspond to different fail types; and
   determining the occurrence of the fail type according to the pass/fail results of a subset of the fail string.

2. The method of claim 1, wherein the test pattern includes a single address.

3. The method of claim 1, further comprising the steps of:
   holding each address individually at the first potential during the first test, yielding in a pass/fail result; and
   holding each address individually at the second potential during the second test, yielding in a pass/fail result.

4. The method of claim 1, wherein the test pattern is a combination of at least two addresses.

5. The method of claim 1, wherein the step of determining the portion of the address space further includes the step of determining at least one x address and at least one y address according to the fail type to be determined, wherein the fail type to be determined is identified using a subset of the addresses in the address space.

6. The method of claim 1, further comprising the step of generating a pseudo compressed bitmap comprising a plurality of cells of the x addresses and y addresses needed to determine the fail type, wherein each cell is one of a passing cell and a failing cell.

7. The method of claim 6, further comprising:
   determining the failing cell upon determining a fail in the pass/fail results for every x–y address combination addressing the failing cell; and
   determining the passing cell upon determining any one passing x–y address combination addressing the passing cell.

8. The method of claim 1, further comprising the step of generating a pareto.

9. A program storage device readable by machine, tangibly embodying a program of instructions executable by the machine to perform method steps for generating a pseudo compressed bitmap for a device, the method steps comprising:
   determining a portion of an address space to test for determining an occurrence of a fail type, wherein the portion of the address space comprises at least one x address and at least one y address of the device;
   executing a test pattern that includes at least one address in the address space at least two times for the at least one address, wherein the at least one address is held at a first potential for at least a first test and a second potential for at least a second test;
   determining a fail string for the device including pass/fail results for the test pattern, wherein different subsets of the fail string correspond to different fail types;
   generating a pseudo compressed bitmap by combining one or more subsets of the fail string; and
   diagnosing a failure of the device according to the pseudo compressed bitmap.

10. The method of claim 9, wherein the test pattern includes a single address.

11. The method of claim 9, further comprising the steps of:
   holding each address individually at the first potential during the first test, yielding in a pass/fail result; and
   holding each address individually at the second potential during the second test, yielding in a pass/fail result.

12. The method of claim 9, wherein the test pattern is a combination of at least two addresses.

13. The method of claim 9, wherein the step of determining the portion of an address space further includes the step of determining at least one x address and at least one y address according to the fail type to be determined, wherein the fail type to be determined is identified using a subset of the addresses in the address space.

14. The method of claim 9, wherein the pseudo compressed bitmap comprises a plurality of cells of the x addresses and y addresses needed to determine the fail type, wherein each cell is one of a passing cell and a failing cell.

15. The method of claim 14, further comprising:
   determining the failing cell upon determining a fail in the pass/fail results for every x–y address combination addressing the failing cell; and determining the passing cell upon determining any one passing x-y address combination addressing the passing cell.

16. A method of generating a pseudo compressed bitmap for a device comprising the steps of:

generating a pseudo compressed bitmap by combining a plurality of pass/fail results of a fail string; and displaying the pseudo compressed bitmap wherein the pass/fail results correspond to at least one X address pin and one Y address pin, and wherein each address pin corresponds to a plurality of pass/fail results, wherein a bit is determined to pass in the pseudo compressed bitmap upon determining that any address pin that addresses the bit passes.

17. The method of claim 16, wherein every combination of a test pattern including at least one address is tested, wherein the combinations include each address held at a first potential for at least a first test and a second potential for at least a second test.

* * * * *